US006404634B1

(12) United States Patent
Mann

(10) Patent No.: US 6,404,634 B1
(45) Date of Patent: Jun. 11, 2002

(54) SINGLE PIECE HEAT SINK FOR COMPUTER CHIP

(75) Inventor: Kristina L Mann, Fort Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/731,315

(22) Filed: Dec. 6, 2000

(51) Int. Cl.[7] .................................................. H05K 7/20
(52) U.S. Cl. ..................... 361/704; 165/80.3; 165/121; 165/185; 257/722; 361/697
(58) Field of Search ..................... 165/80.3, 121–122, 165/185; 257/718, 726–727, 722; 361/690, 704, 694–697; 417/176–178; 415/176, 178

(56) References Cited

U.S. PATENT DOCUMENTS

| | | | |
|---|---|---|---|
| 5,828,551 A | * 10/1998 | Hoshino et al. | 361/697 |
| 5,926,371 A | 7/1999 | Dolbear | 361/704 |
| 6,053,242 A | * 4/2000 | Hsieh | 165/121 |
| 6,116,331 A | 9/2000 | Tustaniwskyj et al. | 165/80.4 |

* cited by examiner

Primary Examiner—Gregory Thompson

(57) ABSTRACT

A heat sink device for transferring heat from a computer chip is comprised of a base, a core and an array of fins that are in the form of a single, unitary piece. In a particularly preferred embodiment of this invention, the array of fins is comprised of a first subarray of fins that each extend to a core cavity wall and a second subarray of fins that extend into the device to a location that lies between the exterior of the device and the cavity wall.

20 Claims, 11 Drawing Sheets

SINGLE PIECE HEAT SINK FOR COMPUTER CHIP

BACKGROUND OF THE INVENTION

1. Technical Field

Integrated circuit devices ("chips") dissipate electrical energy during operation. This electrical energy is transformed into heat. Several important operating parameters of chips vary with the temperature produced by this heat. Indeed, reliable operation of a chip can only be assured below a prescribed operating temperature. Operation of a chip above its prescribed operating temperature can result in damage to the chip, damage to the computer system in which it is used and/or loss of valuable data. Consequently, the heat produced by a chip must be transferred to its surroundings at rates that ensure that the prescribed operating temperature for that chip will not be exceeded.

2. Description of Related Art

Many different heat sink apparatus have been proposed and/or employed to transfer heat from a chip to its surroundings. Those heat sinks taught in U.S. Pat. Nos. 6,116,331 and 5,926,371 are generally representative of such proposals. The heat sink apparatus shown in FIGS. 1 and 2 of this patent disclosure have, in fact, been widely used. The computer chip/heat sink literature generally shows that the operating temperature of a chip that is associated with a chip/heat sink system is largely governed by: (1) the temperature of the ambient surroundings of the chip/heat sink system, (2) the amount of electrical energy dissipated by the chip, and (3) the sum of thermal resistances and thermal interfaces along the heat transfer path leading from the chip to the ambient surroundings. Thus, changes in thermal design of any chip/heat sink system must address at least one of these three factors in ways such that the operating temperature of a given chip does not exceed some specified maximum value.

In the case of chip/heat sink systems relying only on passive direct exposure to their ambient surroundings for cooling (i.e., natural convection), most of the heat energy produced by the chip will flow through a chip/heat sink system (by conduction) and then through the interface between the surface of the heat sink system and its ambient surroundings. Such direct exposure systems have relatively low heat transfer capabilities. These low heat transfer capabilities limit the operational capabilities of many high performance chips. Hence, more complex heat transfer mechanisms (coolers) have been developed for these high performance chips. For example, active, forced air cooling (e.g., through use of fans) of a heat sink associated with a chip, permits that chip to dissipate more heat relative to a chip that relies only on direct exposure of its heat sink to the ambient surroundings. Consequently, chips having fan cooled heat sinks have been widely used with high performance chips.

The chip/heat sink manufacturing arts also have recognized that the mating surfaces of chips and heat sinks are not perfectly flat or smooth (they have microscopic peaks and valleys) and that this circumstance can diminish the system's thermal efficiency. For example, when the mating surfaces of an chip device and a heat sink are brought into direct contact, air gaps remain over a large fraction of the total mating surface area. These air gaps contribute little to the conduction of heat from the chip to the heat sink. The prior art also has recognized that heat conduction from a chip to its heat sink can be improved by filling these air gaps with a thermal interface material which conducts heat more readily than air. Common thermal interface materials include thermal greases and elastomeric pads containing thermally conductive ceramic particles (e.g., particles of boron nitride, aluminum oxide, or magnesium oxide).

These thermal interface materials are normally used in the context of an applied pressure. The applied pressure reduces the overall thickness of the thermal interface material while causing said thermal interface material to fill more of the air gaps. In general, the higher the pressure applied between the chip device and the heat sink, the better the heat transfer between them. This pressure is usually transmitted through means of bolts that run from the heat sink to a backer plate located below the printed circuit board associated with the chip. The prior art also has recognized that the pressure exerted between a heat sink and a chip (across a thermal interface) by such bolts is not always uniform. As a result, heat transfer across such a differently pressured chip/heat sink interface is diminished to varying degrees. This remains true whether or not a thermal interface material is employed.

Thus, larger heat sinks are employed to make up for this source of diminished heat transfer. Indeed, any shortfalls or impediments in heat transfer between the chip and the ambient surroundings in which the chip/heat sink system resides, imply that larger and more expensive heat sinks need to be employed to compensate for the decreased heat transfer. Again, the consequences of not doing this (an overheated chip) are such that many heat sinks are made larger then they would be if they were more thermally efficient. Unfortunately, physical space is also at a premium in most computer systems. Hence, it is always beneficial to have chip/heat sink apparatus that are more thermally efficient, more reliable, smaller and less expensive. The heat sink devices of this patent disclosure produce all of these beneficial effects.

SUMMARY OF THE INVENTION

The heat sink device of this patent disclosure comprises a base, a core and a fan array in the form of a single, unitary piece wherein: (1) the core has a cavity system that is partially defined by a cavity wall; (2) a first array of forward fins extends from an exterior region of the heat sink device to the cavity wall; and (3) a second array of backward fins extends from an exterior region of the device to a portion of the core that lies between the cavity wall and the exterior of the device. Thus, because applicant's heat sink device is unitary in nature, it has no internal thermal interfaces that are inherently present in any heat sink device that is comprised of separate parts that are mechanically assembled to produce an overall heat sink apparatus. Such a multi-component heat sink apparatus is shown in FIG. 2 of the present patent disclosure. It will be used to distinguish applicant's heat sink devices from many of those taught in the prior art.

The heat sink devices of this patent disclosure will be used in conjunction with other mechanical devices. For example, they will be used in conjunction with bolts that are used to pressure the chip between the heat sink and a circuit board with which the chip is associated. To this end applicant's heat sink is provided with an array of holes and an array of sleeves or standoffs that are respectively associated with these holes. These sleeves can be separate and distinct pieces that are mechanically associated with a given hole in the heat sink. In some of the more preferred embodiments of this invention, however, applicant's heat sink device will further comprise an array of sleeves or standoffs that also are part of the single, unitary piece that constitutes the heat sink device. Inclusion of these sleeves in applicant's unitary heat sink device removes those, sleeve-related, thermal interfaces found in prior art heat sinks such as that shown in FIG. 2 of this patent disclosure.

Be its sleeve construction as it may, applicant's heat sink device is positioned between a chip and the heat sink system's ambient surroundings. Thermal interface layers such as those previously described with respect to the prior art also may be used to thermally couple applicant's heat sink device to the chip device it services. Thermal interface layers that require a relatively small amount of pressure between the heat sink and the upper surface of the chip in order to achieve an acceptably low value of thermal resistance between the chip device and the heat sink are generally preferred. Further referring to applicant's chip/heat sink interface, it also should be noted that applicant's heat sink device may have a bottom surface that is flat, or has a protruding plate-like region or has a hollowed out area (i.e., a cavity) sized to enclose the chip with which the heat sink device is associated. The cavity also may also be sized to enclose any decoupling capacitors associated with that chip. A substantially flat ceiling (i.e., upper wall) of such a cavity will be in close proximity to the chip during use. Spacers also may be positioned between the upper surface of the chip and the upper wall of such a cavity in ways that are known to this art.

DETAILED DESCRIPTION OF THE INVENTION

Figure 1:
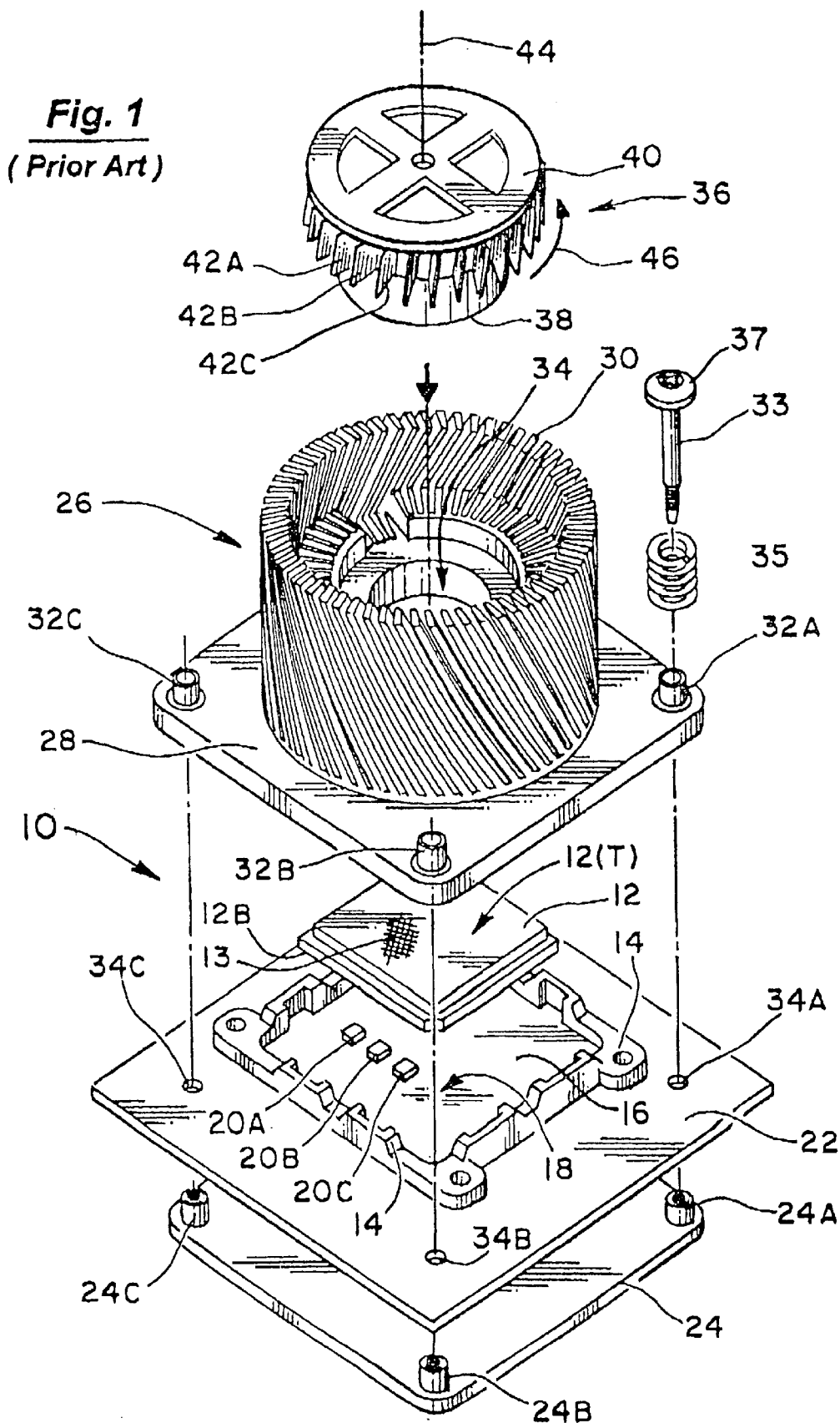
FIG. 1 is an exploded perspective view of a prior art chip/heat sink apparatus.

FIG. 1 is an exploded perspective view of a widely used prior art chip/heat sink system 10. An integrated circuit device ("chip") 12 is shown positioned above a socket 14 that defines a socket cavity 16 in which the chip 12 resides. The bottom region 18 of the socket cavity 16 is shown provided with an array of "bumps" 20A, 20B, 20C, etc. that make electrical contact with select portions of the chip 12 in ways well known to the computer manufacturing arts. The socket 14 rests upon a printed circuit board ("PCB") 22. A backer plate 24 underlies the PCB 22. The backer plate 24 provides structural support for the PCB 22, thereby preventing it from bowing under pressure resulting from the force used to bias the heat sink 26 toward the chip 12. Thus, the backer plate 24 is preferably made of a rigid material. The backer plate 24 is shown provided with an array of backer plate standoffs 24A, 24B, 24C, etc. The center holes of these standoffs are threaded to receive a threaded fastener device such as bolt 33. This bolt 33 may be employed in conjunction with a spring device 35. The head 37 of such a bolt 33 is forced against the top the spring device 35 to produce a controlled pressure between the base 28 of the heat sink and the standoff 24A of the backer plate 24.

Figure 2:
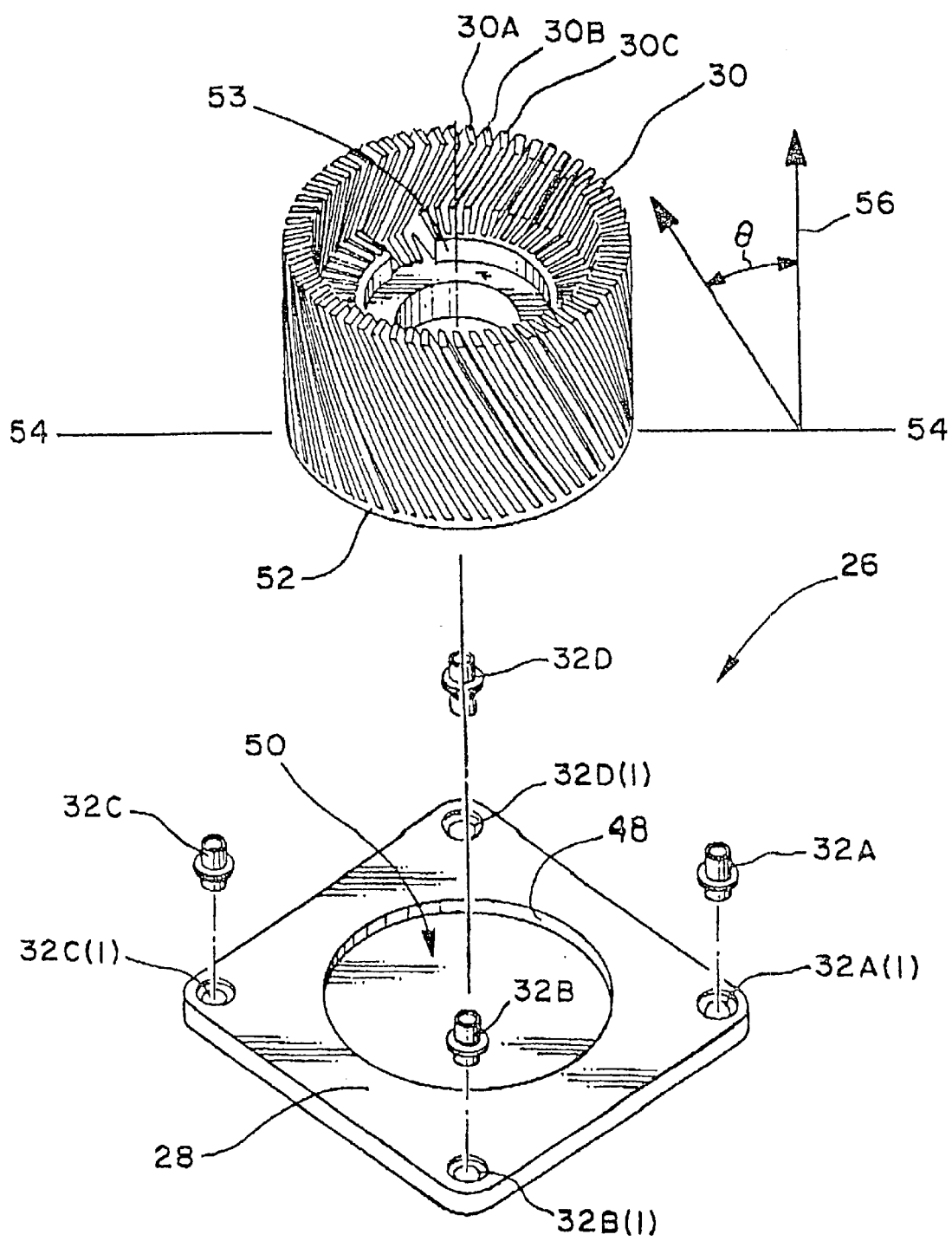
FIG. 2 is an exploded perspective view of a heat sink component of the apparatus shown in FIG. 1.

The heat sink apparatus 26 is shown positioned above the chip 12. As seen in FIG. 2, this heat sink apparatus 26 has three separate and distinct components: a base plate 28, an array of cooling fins 30 and an array of base plate standoffs 32A, 32B, 32C, etc. Thus, a connector bolt, e.g., connector bolt 33, can pass through a given standoff (e.g., standoff 32A), pass through a given hole (e.g., hole 34A) in the PCB 22 and engage with threads in a center hole of a given backer plate standoff (e.g., 24A). Tightening a series of such connector bolts will cause the base plate 28 of the heat sink device 26 to be pressed against the top side 12(T) of chip 12. This, in turn, will cause the bottom side 12B of the chip 12 to be pressed against the bump array 20A, 20B, 20C, etc. shown in the bottom region 18 of socket 14. This pressure, in turn, causes electrical components of the PCB 22 to be pressed into firm contact with the underside of the chip and thereby facilitating exchange of electrical signals between the chip 12 and the PCB 22. As previously discussed with respect to the prior art, a layer of a pliable thermal interface material 13 can be positioned between the upper surface 12T of chip 12 and a bottom surface of the heat sink 26. Again, such thermal interface material 13 serves to thermally couple the heat sink 26 to the chip 12. By way of example only, this thermal interface material 13 could be a thermally conductive elastomer (e.g., thermal interface tape or a thermal interface pad) known to this art.

The heat sink device 26 shown in FIG. 1 also is shown provided with an inner cavity system 34 in which a fan unit 36 can reside. The fan unit 36 has a housing 38 which contains a fan motor (not shown). The fan motor-containing housing 38 resides in a center region of the cavity system 34 in the heat sink device 26. The fan unit 36 includes a rotatable hub 40 (which can include a rotating motor) upon which an array of fan blades 42A, 42B, 42C, etc. is mounted. As the hub 40 is rotated on its center axis 44 by the fan motor (e.g., in the direction suggested by direction arrow 46), air is driven through the spaces between the individual fins of the cooling fin array 30. Thus, heat is driven away from the fin array 30 and thereby enabling the fin array 30 to serve as a "heat sink" for heat generated by the chip 12 that lies beneath the base 28 of the heat sink device 26. This system is therefore a "positive" heat sink system that employs a fan to augment its natural heat dissipation capability.

FIG. 2 is an exploded perspective view of the prior art heat sink apparatus 26 shown in FIG. 1. Again, this heat sink apparatus 26 is comprised of a base 28, an array of cooling fins 30 (e.g., fins 30A, 30B, 30C, etc.) and an array of standoff devices 32A, 32B and 32C. The base plate 28 is shown provided with an array of holes 32A(1), 32B(1), 32C(1), etc. for respectively receiving the standoff devices 32A, 32B, 32C, etc. The base plate 28 also is shown provided with a center hole 48 having a round configuration 50 for receiving a round bottom 52 of a round cooling fin array 30. The bottom surface of the cooling fin array 30 comes into contact with a chip. Thus, this prior art heat sink apparatus 26 is characterized by the fact that it is comprised of several separate and distinct components that are mechanically assembled to produce the overall heat sink apparatus 26 shown in FIG. 1.

Those skilled in the thermal transfer arts will appreciate that a multi-component heat sink system is not as thermally efficient as a single, unitary or monolithic piece of the same size, shape and material. That is to say that thermal interfaces are created between separate and distinct pieces no matter how tightly they are abutted against each other. In other words, such mechanical interfaces create thermal interfaces that serve to lower the thermal transfer efficiently of a heat sink device. For example, the lower regions of the fin array 30 and the side surface of the center hole 48 can be regarded as being both a mechanical and a thermal interface. Hence, heat must be transmitted over this mechanical/thermal interface in traveling from a heat generating chip (such as the chip 12 shown in FIG. 1) to the base 28. Thus, this round mechanical interface also is a thermal barrier. Again, this will be the case, even if there is direct and forceful physical abutment between the side of the hole 48 and lower regions of the fin array 30. Those skilled in these arts also will appreciate that, if there is an air gap between the side of the hole 48 and the fin array 30 the thermal efficiency of the heat sink device 26 will be diminished all the more. The same thermal barrier considerations apply to each of the standoffs 32A, 32B, 32C, etc. That is to say that they too are separate and distinct pieces that create thermal interfaces (and hence thermal barriers) between the heat-generating chip and the ambient air that surrounds the fin array 30 and base plate 28.

FIG. 2 also illustrates that the individual fins 30A, 30B, 30C, etc. that comprise the prior art fin array 30 are in a "slanted" orientation with respect to the horizontal plane 54 of the underside 52 of the fin array 30. They also all are connected to the same wall component 53 of the fin array 30. The degree of this slanting is depicted by angle theta in FIG. 2. This slanting fin design provides more fin surface area, relative to a fin array wherein the individual fins are oriented in a perpendicular manner (see direction arrow 56) with respect to the horizontal plane 54 of the underside 52 of the fin array 30. It also should be understood that this slanted orientation of the fins 30A, 30B, 30C must be created by machining the walls of a tube-shaped precursor to the fin array 30. In effect, the walls of such a tube-shaped fin precursor are "sawed" on an angle theta that creates the degree of slant of the individual fins of the fin array 30 shown in FIG. 2. This sawing is an extremely precise, time consuming, and hence costly, machining procedure. It also involves a great deal of costly breakage of the precursor tubes.

Those skilled in this art will appreciate that these costly machining operations are undertaken (1) because fin surface area is very "valuable" and (2) because this machining operation does in fact produce greater fin surface area relative a straight up and down fin orientation suggested by arrow 56 in FIG. 2. The value of the extra fin surface area follows from that fact that excessive heat can have a devastating effect on the operation of a chip. Therefore, high cost or not, excessive heat simply must be removed from a chip. This high cost was borne with respect to the heat sink apparatus shown in FIG. 2 in order to obtain a relatively small (10–15%) increase in the fin system's surface area.

It should also be noted that those metals that are best suited to withstanding the series of slanted saw cuts needed to create the slanted fin array 26 shown in FIG. 2 are not necessarily the metals that have the best heat transfer properties. Hence, the slanted fin system of the prior art device depicted in FIG. 2 represents, to some degree, compromise between the mechanical strength the fins need to withstand the machining operations needed to create their slanted orientations, and the ability of the metal to transfer heat from the fins to their ambient surroundings. As will be seen throughout the remainder of this patent disclosure, applicant's heat sink device completely eliminates the need for this very expensive machining operation.

Figure 3:
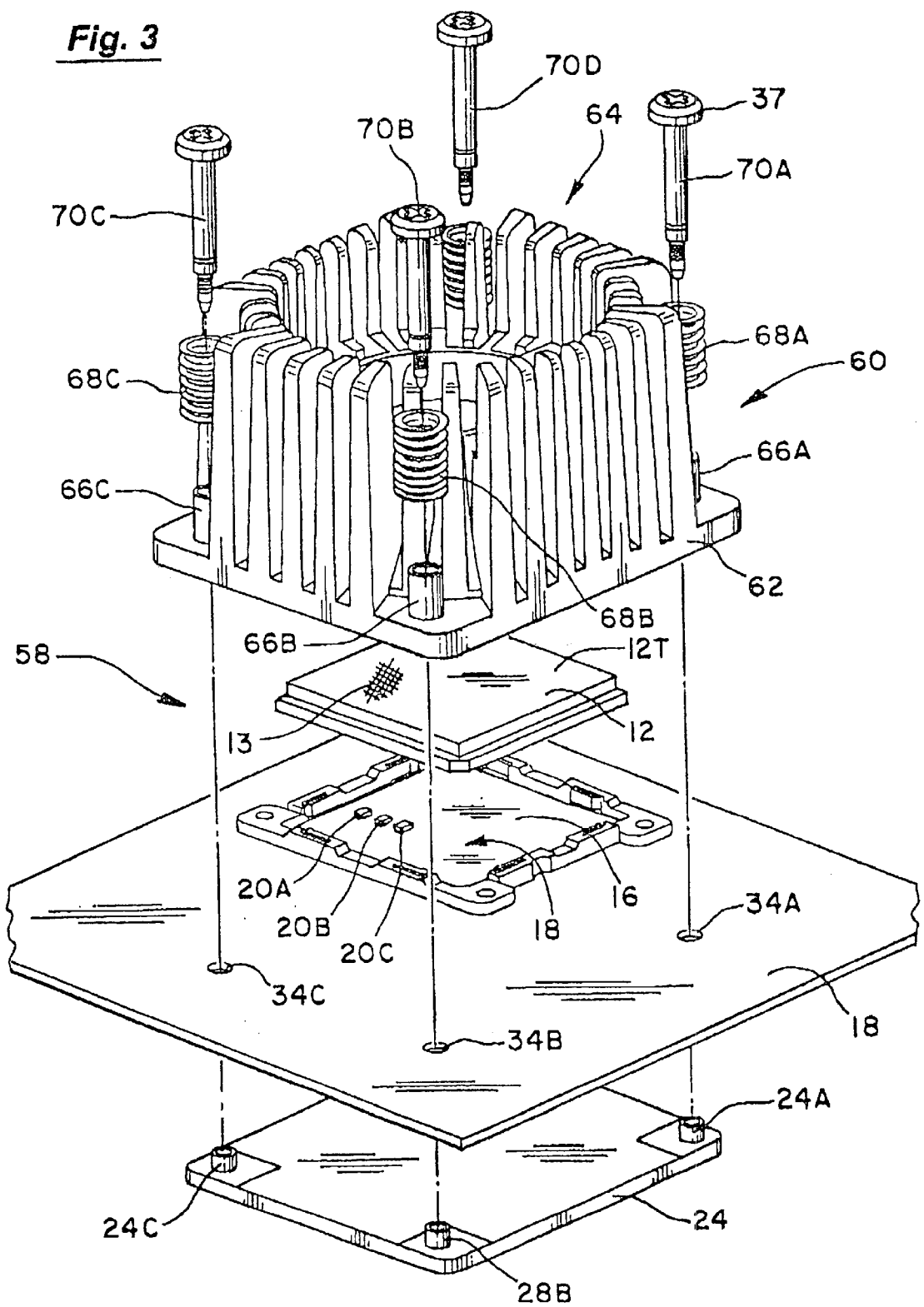
FIG. 3 is an exploded perspective view of a chip/heat sink apparatus of the present patent disclosure.

FIG. 3 is an exploded perspective view of a chip/heat sink system 58 employing a heat sink device 60 made according to the teachings of the present patent disclosure. Those elements of the chip/heat sink system 58 from the chip 12 downward, i.e., from the chip 12 to the backer plate 24, can be regarded as being substantially the same as their counterpart components in FIG. 1. Their identities, functions and locations were discussed with respect to FIG. 1; hence they need not be repeated with respect to FIG. 3. It should be noted, however, that applicant's system also can include a layer of a pliable thermal interface material 13 which can be positioned between the upper surface 12T of chip 12 and a bottom surface of applicant's heat sink 60 in order to better thermally couple heat sink 60 to the chip 12. This thermal interface material 13 can be made of a thermally conductive elastomers (e.g., thermal interface tape or a thermal interface pad) known to this art.

FIG. 3, does however, depict a heat sink device 60 that is decidedly different from the heat sink device 26 shown in FIG. 1. Applicant's heat sink device 60 has a base 62, a fin array 64 and a first array of standoffs 66A, 66B, 66C; but these elements differ from the prior art heat sink device 26 in that, at the very least, applicant's base 62 and fin array 64 components constitute a single, unitary piece. Such single piece construction can be created by known forging, casting, die-casting or molding operations. Any of them can create a unitary or monolithic body such as the heat sink 60 shown in FIG. 3. Since this heat sink apparatus 60 is unitary in nature, it does not have the thermal interfaces (and hence the thermal barriers) that were discussed with respect to the multi-pieced heat sink device 26 shown in FIG. 1. Applicant's invention decreases these thermal barriers by providing a method whereby the base plate and fin array can be made as a single monolithic piece. Hence, because the base 62 and fin array 64 have no mechanical interfaces it presents no thermal barriers such as those noted with respect to the heat sink 26 shown in FIG. 2. In the more preferred embodiments of this invention the sleeves or standoffs (66A, 66B, 66C, etc.) on the base 62 also will be part of the unitary nature of the heat sink 60. That is to say that these sleeves or standoffs 66A, 66B, etc. also will be created by the forging, casting, die-casting or molding operation used to produce the heat sink device 60.

As another optional feature, the heat sink apparatus 60 can be provided with an array of springs 68A, 68B, 68C, etc. Such springs (68A, 68B, etc.) are especially well suited to supplying a desired pressure between the heat sink apparatus 60 and the standoffs 24A, 24B, 24C in backer plate 24. To this end, FIG. 3 shows four fastener devices 70A, 70B, 70C and 70D (e.g., shoulder bolts). In effect, they serve to sandwich the computer chip 12 between the PCB 22 and the heat sink apparatus 60.

Figure 4:
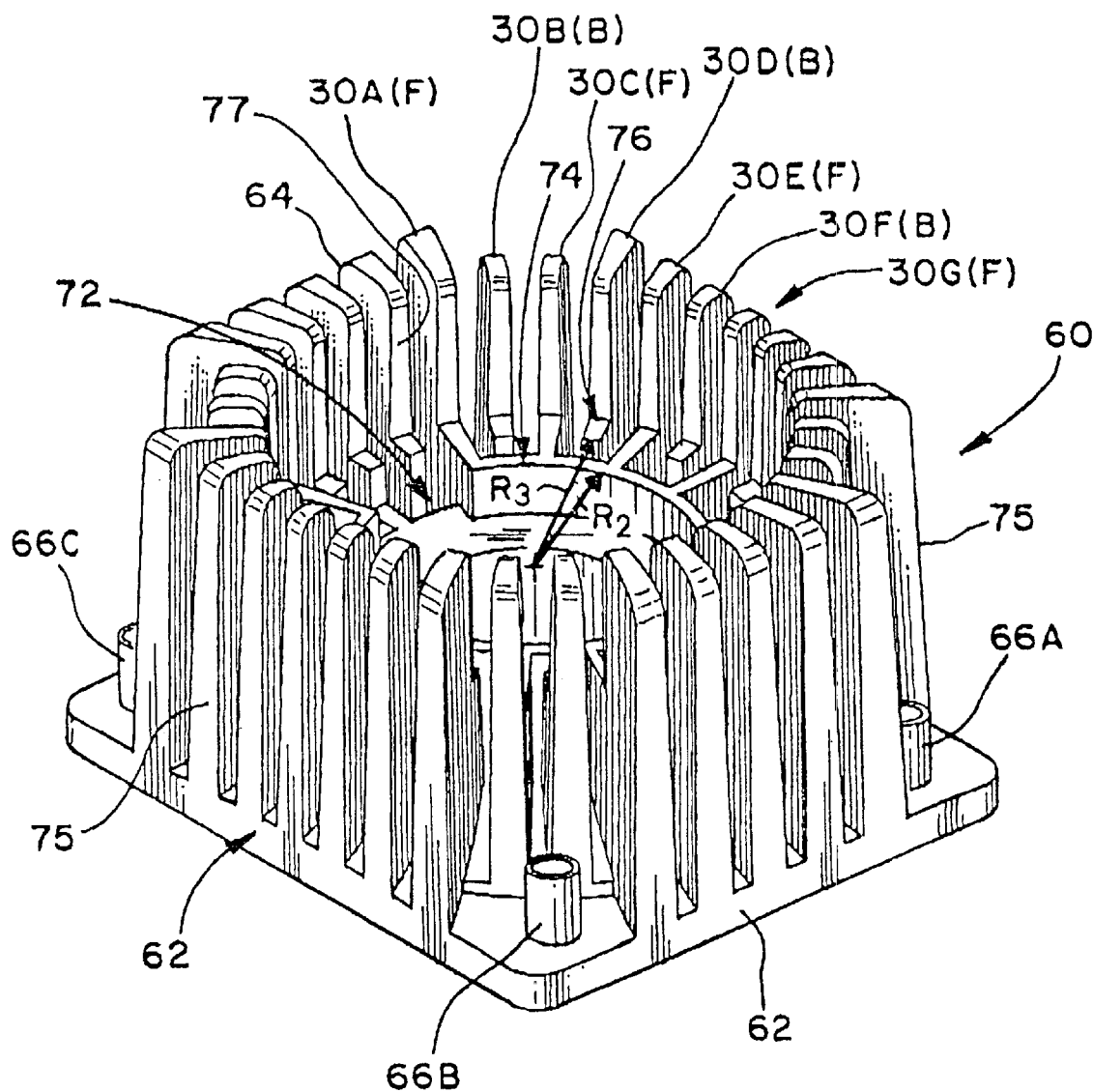
FIG. 4 is a perspective view of the heat sink component of the chip/heat sink apparatus shown in FIG. 3.

FIG. 4 depicts a perspective view of a heat sink apparatus 60 of the present patent disclosure. Again, in its more preferred embodiments it constitutes a single piece. In a somewhat less preferred, but still viable, embodiment of this invention, the standoffs (66A, 66B, 66C, etc.) are not made by the forging, casting, die-casting, molding operation, but rather are added to the base 62 as separate pieces as in the prior art method suggested in FIG. 2. FIG. 4 also illustrates that the fin array 64 has at least two fin types in the fin array 30A(F), 30B(B), 30C(F), 30D(B), 30E(F), 30F(B) and 30G (F). In this designation system the letter F, in brackets, i.e., "(F)" is intended to mean "Forward". The letter B, in brackets, i.e., "(B)" is intended to mean "Backward".

In order to further clarify the meaning of these (F) and (B) designations, it should be noted that applicant's heat sink device 60 has a center cavity system 72 comparable to the cavity system 34 shown in the prior art heat sink 26 of FIG. 1. This comparability follows from the fact that both cavities (72 and 34) generally perform the same function; namely holding a fan unit such as the fan unit 36 shown in FIG. 1. Applicant's cavity system 72 differs from the cavity system 34 shown in FIGS. 1 and 2 in that applicant's cavity system 72 includes a cavity wall 74 to which only every other fin is attached. By way of distinction, all of the slanted fins 30A, 30B, 30C shown in FIG. 2 all lead to the same cavity wall 53. The radius R2 shown in FIG. 4 extends to the inside surface of this cavity wall 74.

Those fins (e.g., fins 30A(F), 30C(F), 30E(F) and 30G(F), etc.) that extend "forward" to the body of the cavity wall 74 have a "(F)" in their designation. Those fins (e.g., fins 30B(B), 30D(B), 30F(B), etc.) that are set "back" from the cavity wall 74 have a "(B)" in their designation. The forward sides 77 of these set back fins also can be thought of as being set back to an imaginary circle 76. The radius R3 shown in FIG. 4 depicts the distance this imaginary circle 76 is set back from the center of the cavity system 72. Thus the forward sides of the "(B)" fins are positioned around imaginary circle 76 and lie between the cavity wall 74 and the exterior surface 75 of the heat sink 60.

Figure 5:
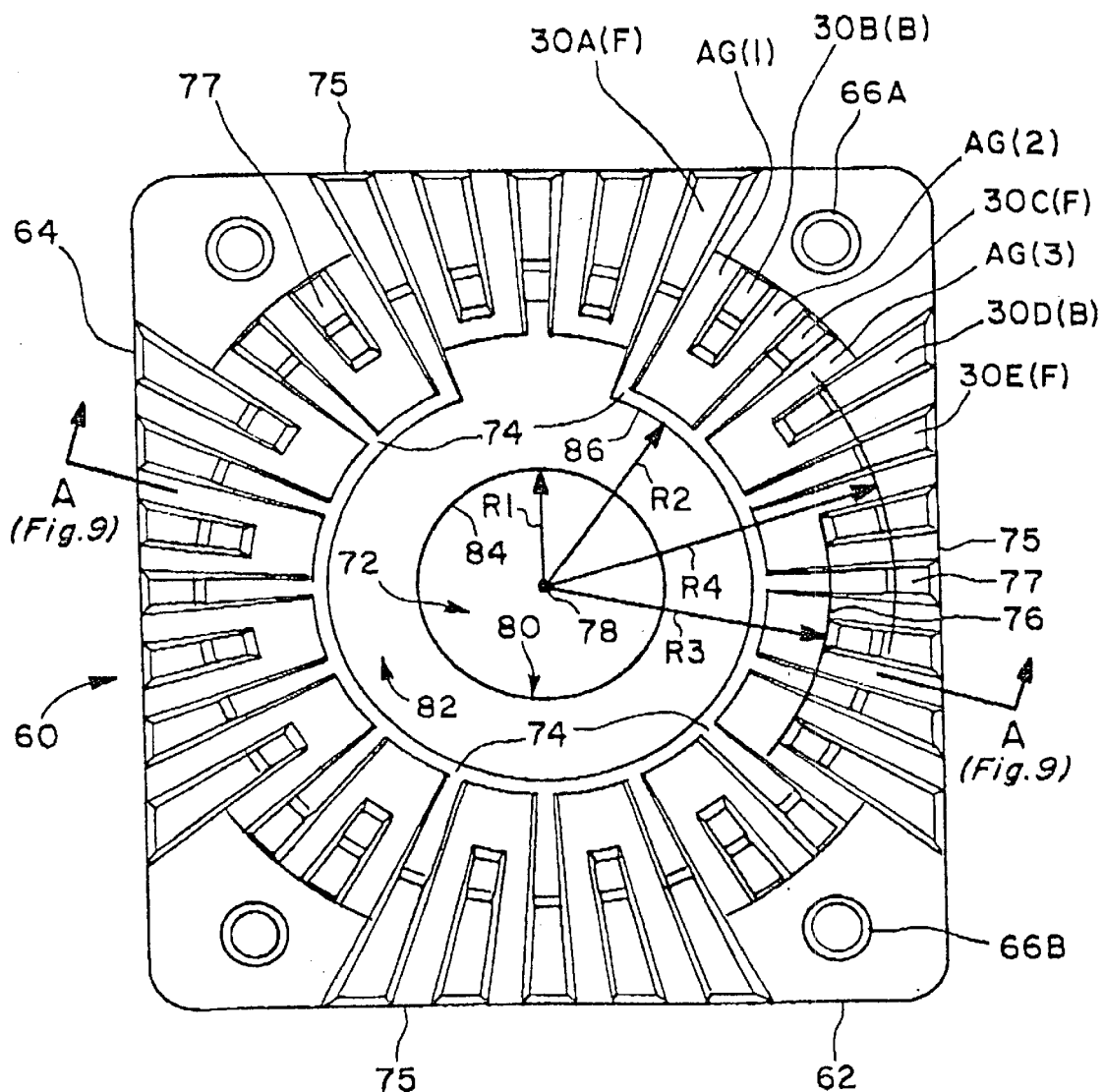
FIG. 5 is a top view of the heat sink component shown in FIG. 4.

FIG. 5 is a top view of the heat sink apparatus 60 shown in FIG. 4. This top view shows a cavity system 72 that preferably further comprises an inner cavity 80 having a radius R1. It serves to lower the weight of the heat sink apparatus. Thus, this inner cavity 80 is an optional feature of this apparatus. This inner cavity 80 is shown surrounded by a ledge 82 that extends to the inner surface 86 of the cavity wall 74. The bottom of a motor housing (not shown) can rest upon the ledge 82. Moreover, the bottom of the motor housing can be attached to the ledge 82 (e.g., by gluing). Thus, the general function of this cavity system 72 is intended to hold a round motor housing such as the round motor housing 38 of the fan unit 36 shown in FIG. 1. Again, the ledge 82 extends from the inner cavity wall 84 (further defined by radius R1) to the inner surface 86 of cavity wall 74. The inner surface 86 of the cavity wall 74 also is defined by radius R2. FIG. 5 also shows the cavity wall 74 to be the heat sink 60 component to which the "forward" fins (e.g., 30A(F), 30C(F), etc.) extend. FIG. 5 also shows a third radius R3. This is the radius distance to which the forward sides 77 of the "set back" fins (30B(B), 30D(B), etc.) are set back from the center 78 of the cavity system 72. Again, this set back distance R3 can be thought of as creating an imaginary circle 76 around the center 78 of the cavity system 72. Thus, the front side 77 of any (B) type fin lies between the cavity wall 74 and the outside surface 75 (the outside surfaces of the array 64 of fins) of the heat sink 60. FIG. 5 also depicts an array of air gaps AG(1), AG(2), AG(3), etc. between the fins. For example, air gap AG(1) is between fin 30A(F) and fin 30B(B). AG(2) is between fins 30B(B) and 30C(F).

Applicant has established that this alternating or staggered fin arrangement (F), (B), (F), (B, (F), etc. can be used to great advantage in reliably creating (e.g., with less tool breakage) heat sink devices having greater fin surface area in a given sized heat sink. By way of contrast, applicant has determined that if each and every fin (e.g., fins 30A(F), 30B(B), 30C(F), 30D(B), etc.) is extended to the cavity wall 74 (e.g., in the manner that fins 30A(F), 30C(F), etc. are so extended to said cavity wall 74 in FIG. 8), the wall region becomes so "crowded" with fins that parts of the cavity wall 74 may not be completely filled with the semi-liquid metal used to create the heat sink apparatus. Moreover, the die tool, forge tool, mold tool, etc. that is used to create the air gaps AG(1), AG(2), etc. between each adjoining fin must be much thinner when all of the fins extend to the cavity wall 74. This tool element "thinness" leads to breakage of the air gap-creating components of the tool itself. This circumstance will be further considered in applicant's discussion of FIG. 8.

Figure 6:
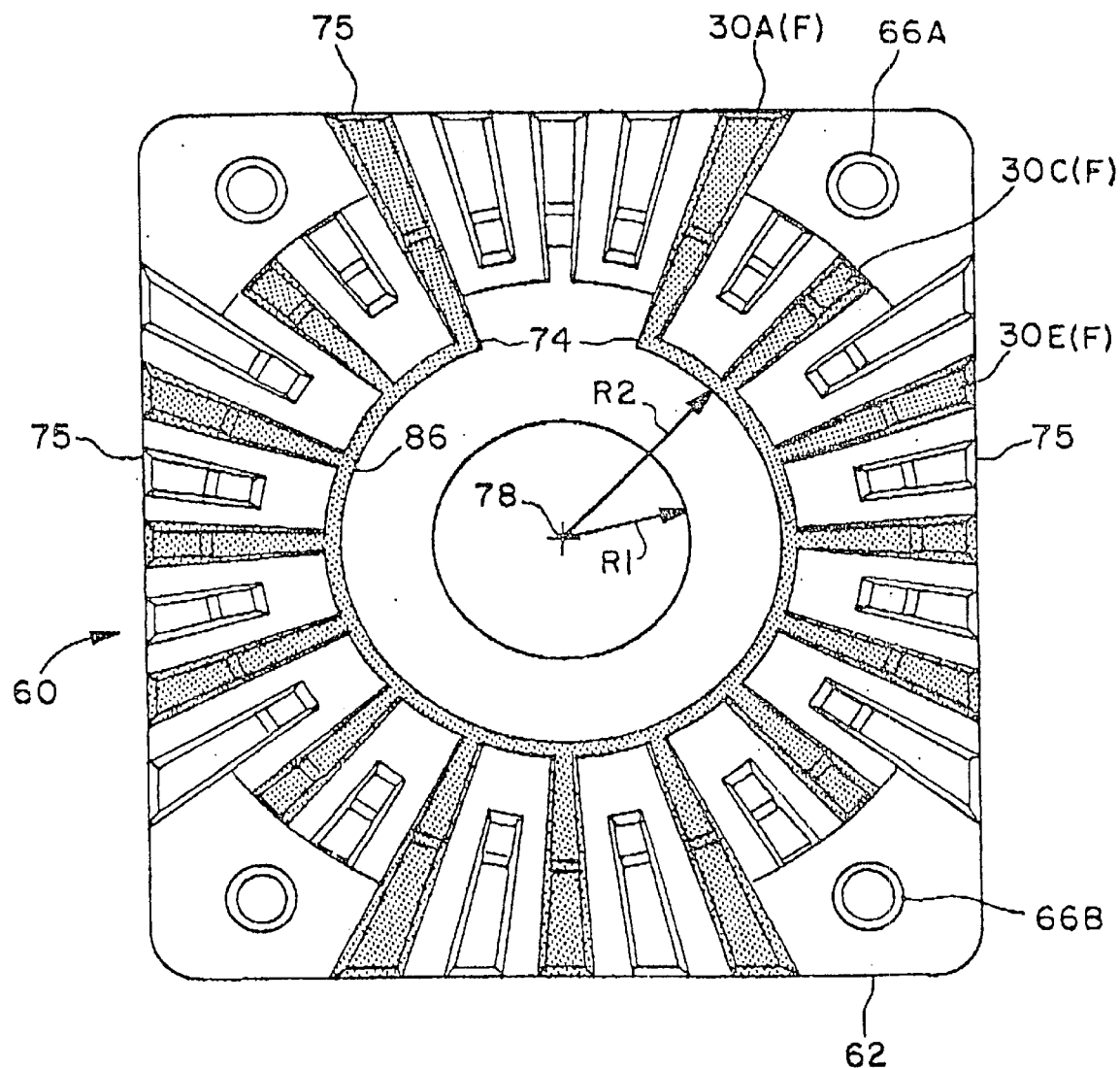
FIG. 6 uses shaded lines to illustrate that a first set of alternate fins of the heat sink device of this patent disclosure extend from the exterior regions of the apparatus to a cavity wall region of said device.

FIG. 6 is a top view of the heat sink apparatus 60 shown in FIG. 4. It is a near repeat of the top view of the heat sink apparatus 60 shown in FIG. 5. For the sake of illustration only, those fins that extend forward to the cavity wall 74 (e.g., fins 30A(F), 30C(F), 30E(F), etc.) in FIG. 6 are shown in shading. The cavity wall 74 into which these fins are melded also is shown in the same shading. This forward (F) array of fins can be thought of as a first, alternating fin array. This first fin array "alternates" (or is staggered) by virtue of the fact that each forwardly set fin (F) is separated by a backwardly set fin (B).

Figure 7:
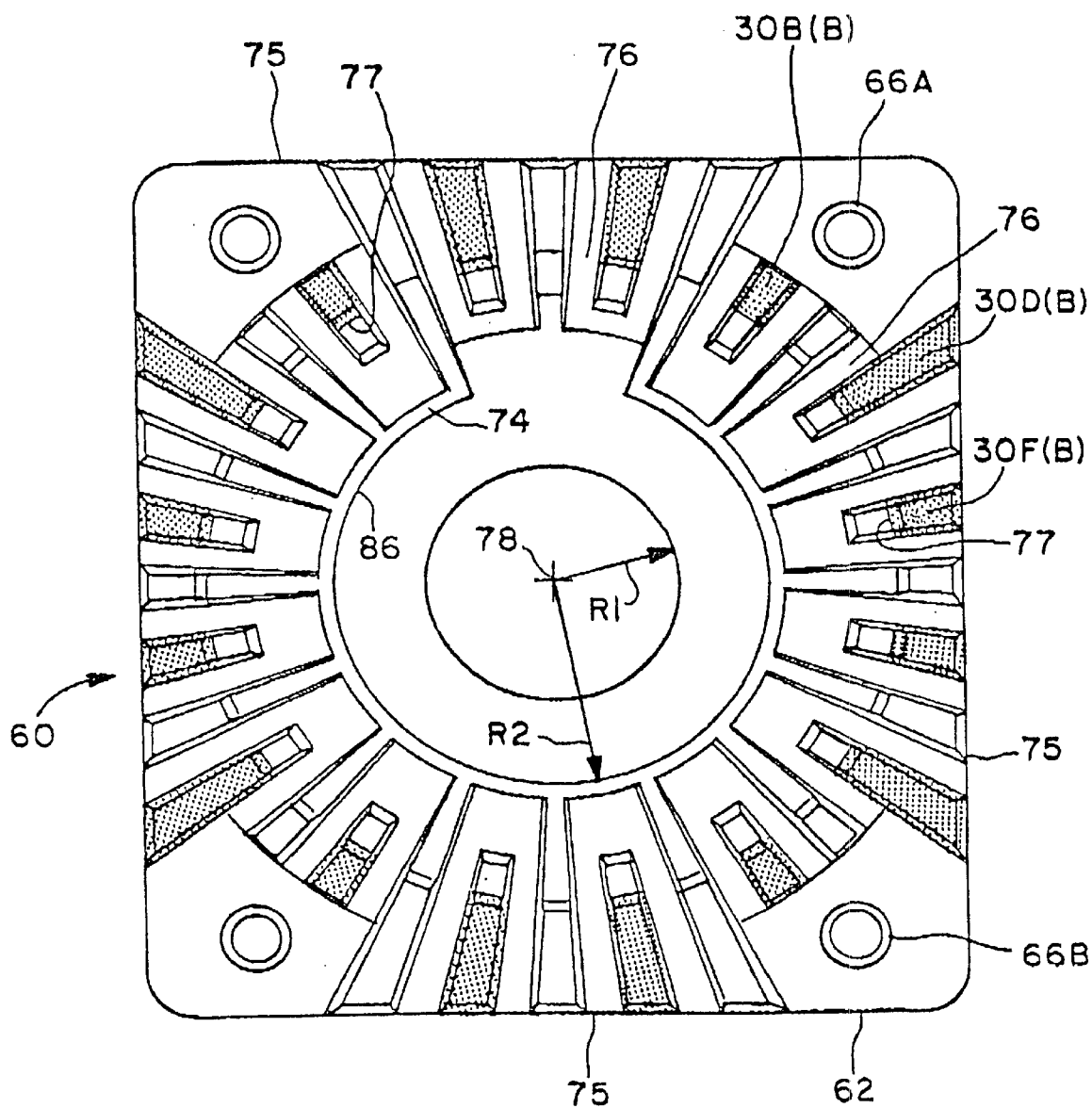
FIG. 7 uses shaded lines to illustrate that a second set of alternate fins does not extend to the cavity wall region, but rather extends to a region that lies between the exterior of the device and the cavity wall region.

By way of contrast with FIG. 6, FIG. 7 shows those fins (B) that are set back from the cavity wall 74 in shading. Consequently, this backward (B) array of fins (e.g., fins 30B(B), 30D(B), 30F(B), etc.) can be thought of as a second, alternating fin array. This second fin array "alternates" (or is staggered) by virtue of the fact that each backward fin (B) is separated by a forward fin (F). Thus, the backwardly set fins (B) are set back from the center 78 of the cavity system by a radius distance that places the inside surfaces 77 of the (B) fins between the cavity wall 74 and the exterior 75 of the apparatus 60. It might also be noted in passing that the cavity wall 74 can have a region where the height of the cavity wall 74 is lowered to allow for easy passage of wires (not shown) leading from a fan motor (not shown) to the exterior 75 of the heat sink 60.

Figure 8:
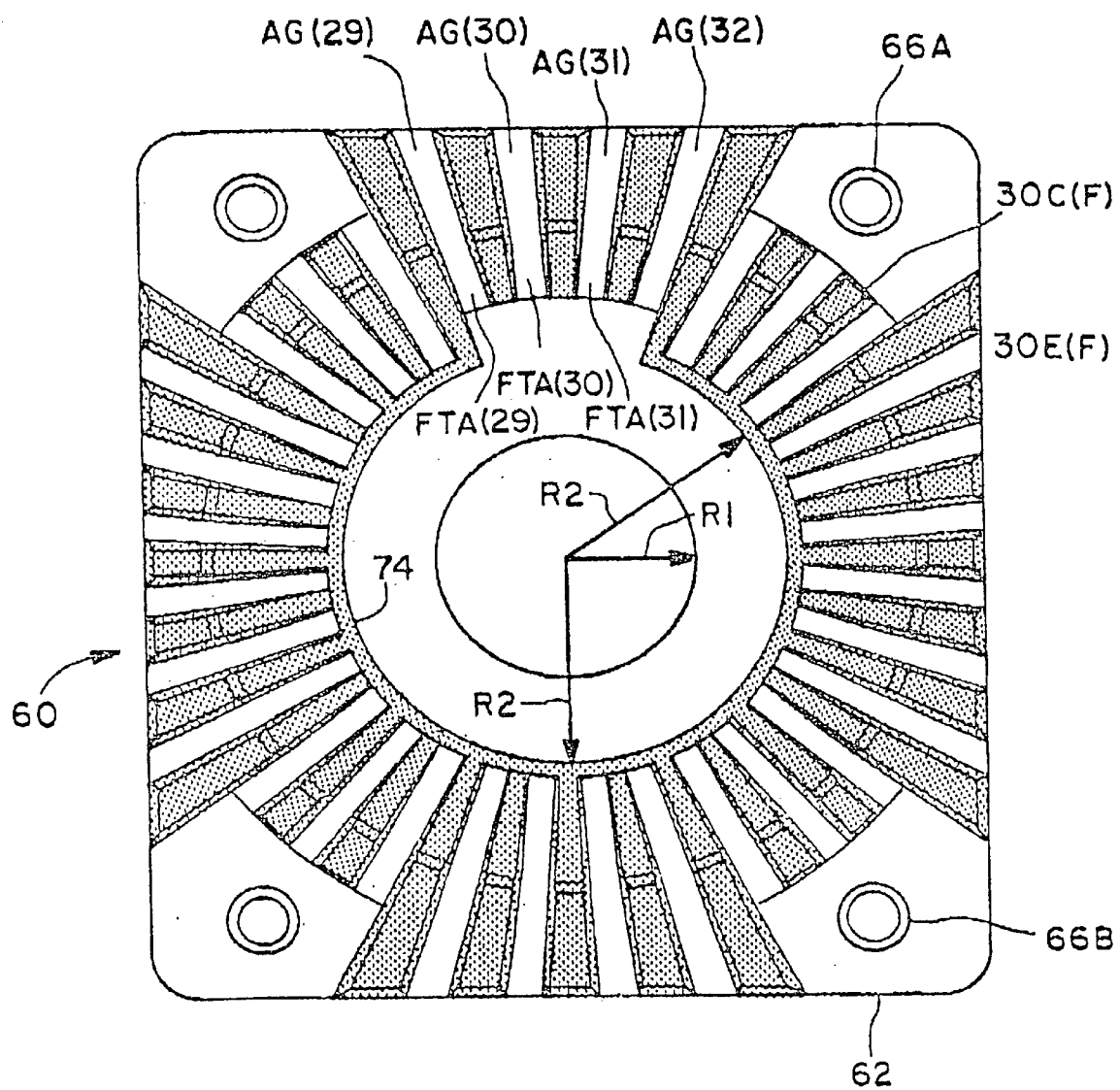
FIG. 8 uses shaped lines to depict a fin array wherein each fin is assumed to extend to a cavity wall region of this assumed heat sink device.

FIG. 8 depicts the undesired circumstance wherein all of the fins (shown in shade) are attached to a cavity wall 74 otherwise comparable to the cavity wall 74 shown in FIG. 6. In other words, there are no forward "(F)" or backward "(B)" designations associated with these fins because they are all "forward" i.e., they are all attached to the cavity wall 74. FIG. 8 also shows that the air gaps ("AG") between the fins (e.g., air gaps AG(29), AG(30), AG(31), AG(32), etc.) get more and more narrow as they approach the cavity wall 74. Applicant has determined that at least two undesired results follow from this "crowding" of all of the fins upon the cavity wall 74.

The first undesired result is that the cavity wall 74 itself may be "underfilled" with the metal used to form the heat sink apparatus whenever so many separate fins are so close together, near the cavity wall 74. The second undesired result follows from the fact that the tools used to forge, cast, die-cast or mold such an "all forward (F) fin array" become too "thin" in their forward tool arm ("FTA") regions (e.g., FTA(29), FTA(30), FTA(31), etc.). In short, when all of the fins are connected to the cavity wall 74, the thin forward tool arms needed to accomplish this fin arrangement tend break off when the tool is applied to the semi-molten metal material from which the heat sink is made and/or when the tool is removed from contact with such closely spaced fin elements. By way of contrast, there is a great deal more space between adjoining fins in the heat sink devices depicted in FIGS. 6 and 7. This implies that the tool elements used to create these wider spaces can be relatively "thicker" and, hence, stronger and far less likely to break off during the forging, die-casting, casting or molding operations used to create these heat sinks. Thus, the (F), (B), (F), (B), (F), etc. fin system of applicant's heat sink devices can be made with far less chance of damage to the air gap-creating tool elements themselves.

Figure 9:
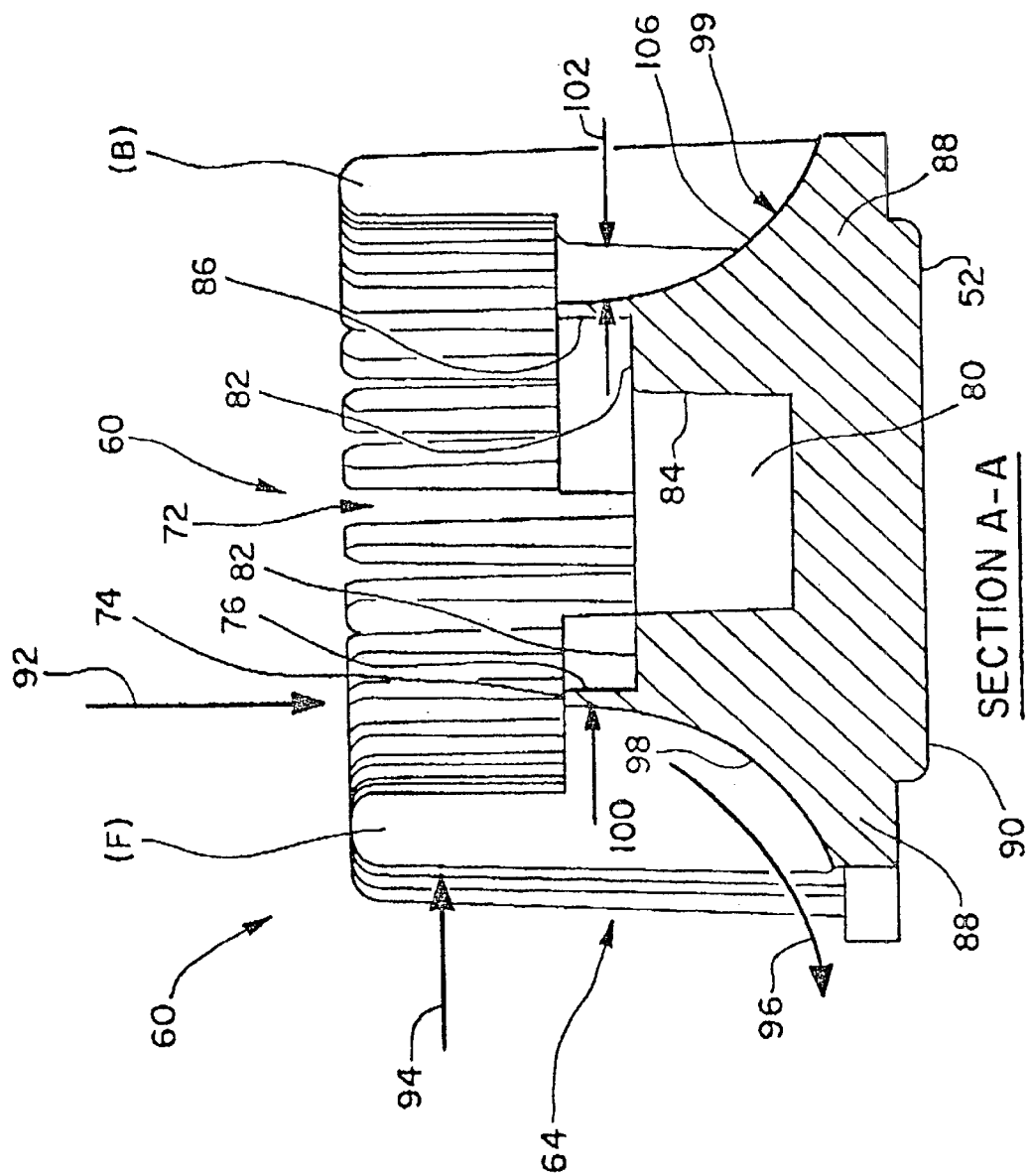
FIG. 9 is a cross sectional view of the heat sink device shown in FIG. 5.

FIG. 9 is a section A—A view of a representative heat sink device 60 shown in FIG. 5. Again, this device 60 is a single monolithic piece. For the purposes of illustration, the end fins (F) and (B) have not been cut by section A—A of FIG. 5 and therefore are not cross hatched in the way that the core region 88 of the heat sink device 60 is cross hatched. In any case, FIG. 9 shows the core region 88 having a cavity system 72 in which a motor housing, such as the motor housing 38 of fan 36 of FIG. 1, resides. Since the fan unit's blades rotate in the heat sink's cavity system 72, they should not extend to the distance R4 shown in FIGS. 5 and 10. Otherwise they would collide with the inner surface of the upper regions of the fins. As the blades of such a fan (not shown) rotate, air is drawn in the inward directions 92 and 94 and is expelled in the downward and outward direction 96 over the top of the core 88 and over the fin surfaces. The downwardly directed air flow 96 cools the downwardly sloping, external surface 98 of the core 88 of the heat sink apparatus 60 as well as the fins that are melded to said core 88.

The cross sectional view of FIG. 9 also shows that the right or inward side of forward fin (F) extends to a front region 100 of the cavity wall 74. By way of contrast, the backwardly set fin (B) is set back from a comparable front region of the right side of the cavity wall 74 by a distance 102. FIG. 9 also shows that even though the backwardly set fin (B) does not meld into the cavity wall 74, it does meld into the core region 88. Hence, heat is conducted from the core to the fin. This melding takes place along the interface line 99 between the bottom regions of fin (B) and the core region 88 of the apparatus 60. The higher end of this interface line 99 is designated by 106 in FIG. 9. FIG. 9 also depicts (by way of example only) the bottom surface 52 of heat sink device 60 provided with plate-like protrusion 90.

Figure 10:
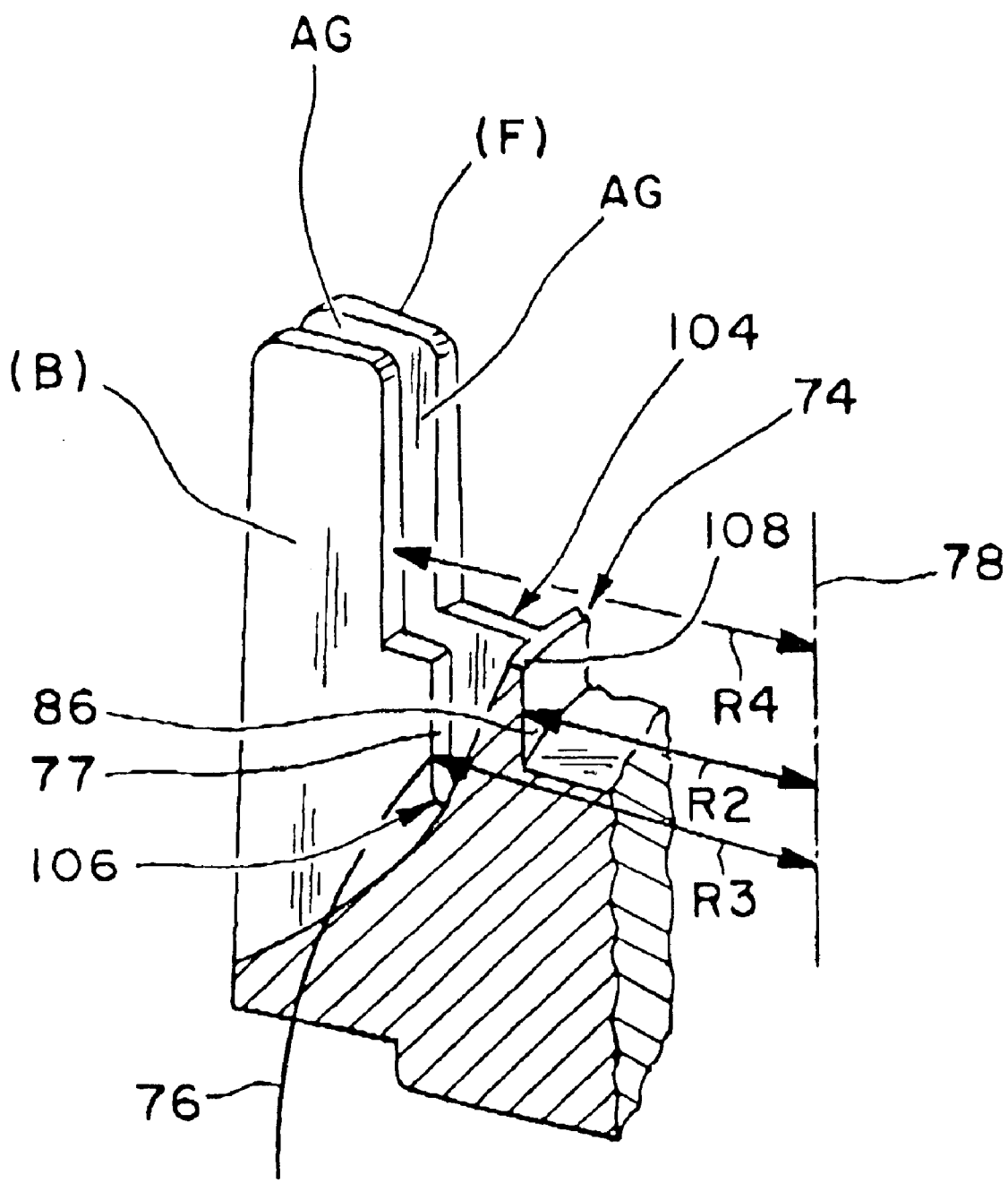
FIG. 10 is a perspective view of two neighboring fins of the heat sink device of this patent disclosure.

FIG. 10 depicts a perspective view of two adjacent fins (B) and (F) made and positioned in accordance with the teachings of this patent disclosure. They are separated by an air gap AG. The leading part 104 of fin (F) extends to, and melds into, the cavity wall 74. The inner wall 86 portion of the wall 74 is defined by radius R2. The set back fin (B) is melded into a lower region 99 of the core 88 (as was shown in FIG. 9). The top of this melded region is designated by item 106 as it was in FIG. 9. Thus, the fin (B) is attached to the core 88, but is not competing with fin (F) in the region of the wall 74 generally designated at point 108. As previously noted the forward side 77 of fin (B) is set back from the center 78 of the cavity by a radius distance R3. The upper parts of fins (B) and (F) are set back from the center 78 of the cavity 72 by a radial distance R4. The radial distance R4 also radially defines an upper cavity region in which the fan blades rotate.

Figure 11:
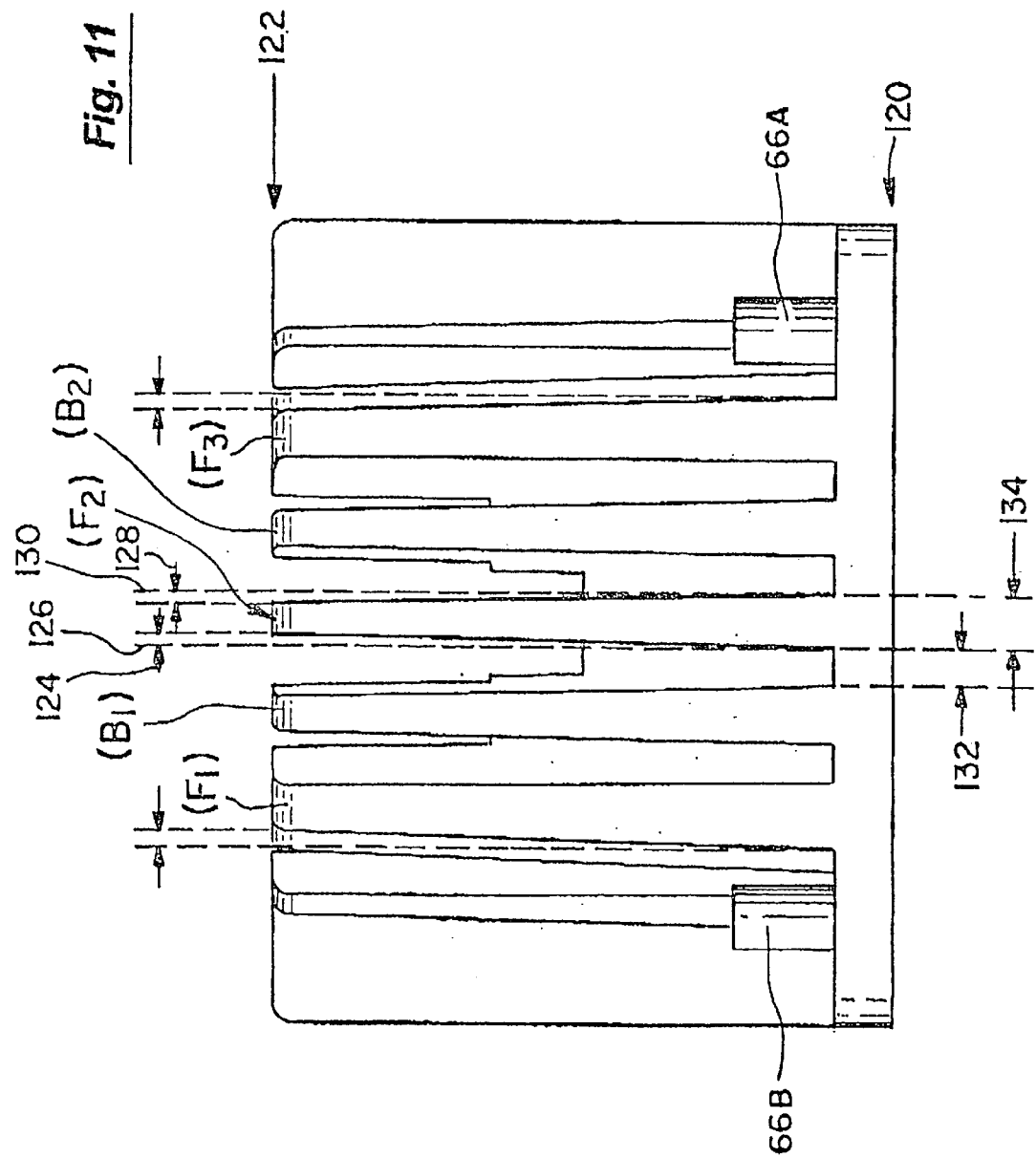
FIG. 11 is a side view of a representative heat sink device of the present patent disclosure.

FIG. 11 illustrates a side view of a preferred embodiment of this invention wherein an array of substantially vertically oriented fins ($F_1$), ($B_1$), ($F_2$), ($B_2$), ($F_3$), etc. are provided with drafts between the bottom 120 of the heat sink device 60 and the top 122 of said device. A first draft is depicted by the distance 124 that the left side of fin ($F_2$) departs from vertical line 126. A comparable draft for the right side of fin ($F_2$) is depicted by the distance 128 that the right side of fin ($F_2$) departs from vertical line 130. All such drafts serve to facilitate the removal of the heat sink device 60 from the tool used to forge, die-cast, cast or mold said apparatus. FIG. 11 also illustrate a preferred embodiment of this invention wherein the width 132 of an air gap, e.g., the air gap between fin ($F_2$) and fin ($B_1$) at its base is less than the width 134 of a given fin, e.g., fin ($F_2$), at its base.

Although the preceding disclosure sets forth a number of embodiments of the present invention, those skilled in this art will appreciate that other arrangements or embodiments, not precisely set forth, could be practiced under the teachings of the present invention. Therefore, the scope of this invention should only be limited by the scope of the following claims.

I claim:

1. A heat sink for transferring heat from a chip, said heat sink comprising a base, core and fin array in the form of a unitary piece, and wherein:
   (1) the core has a cavity that is partially defined by a cavity wall,
   (2) the fin array comprises an array of forward fins and an array of backward fins,
   (3) the array of forward fins extends from an exterior region of the heat sink to the cavity wall,
   (4) the array of backward fins extends from the exterior region of the heat sink to a portion of the core that lies between the cavity wall and the exterior region of the heat sink, and
   (5) the array of forward fins and the array of backward fins are arranged along the cavity wall by alternating a fin from the array of forward fins with a fin from the array of backward fins.

2. The heat sink of claim 1 that further comprises an array of standoffs, each of which has a hole for receiving a connector bolt.

3. The heat sink of claim 1 that further comprises an array of standoffs, each of which has a hole for receiving a connector bolt and each of which is part of the unitary piece that constitutes the heat sink.

4. The heat sink of claim 1 that further comprises an array of standoffs, each of which has a hole for receiving a connector bolt, and another array of standoffs, each of which has a hole for receiving a connector bolt.

5. The heat sink of claim 1 that further comprises an array of standoffs, each of which has a hole for receiving a connector bolt and each of which is part of the unitary piece that constitutes the heat sink, and an array of springs each of which has a hole for receiving a connector bolt.

6. The heat sink of claim 1 wherein the cavity further comprises a ledge for holding a fan housing and an upper cavity region in which fan blades rotate.

7. The heat sink of claim 1 wherein the cavity wall has a lowered region for passing wires leading from a fan motor to the exterior of the heat sink.

8. The heat sink of claim 1 wherein the base has a flat underside.

9. The heat sink of claim 1 wherein the base has an underside that further comprises a plate-like protruding portion.

10. The heat sink of claim 1 wherein the base has an underside that further comprises a cavity for receiving a chip.

11. A heat sink apparatus for transferring heat from a chip, said apparatus comprising a chip and a heat sink having a base, core and fin array as a unitary piece, and wherein:

(1) the core has a cavity that is partially defined by a cavity wall, (2) the fin array comprises an array of forward fins and an array of backward fins, (3) the array of forward fins extends from an exterior region of the apparatus to the cavity wall, the (4) array of backward fins extends from the exterior region of the apparatus to a portion of the core that lies between the cavity wall and the exterior region of the apparatus, and (5) the array of forward fins and the array of backward fins are arranged along the cavity wall by alternating a fin from the array of forward fins with a fin from the array of backward fins.

12. The heat sink apparatus of claim 11 that further comprises an array of standoffs, each of which has a hole for receiving a connector bolt.

13. The heat sink apparatus of claim 11 that further comprises an array of standoffs, each of which has a hole for receiving a connector bolt and each of which is part of the unitary piece that constitutes the heat sink.

14. The heat sink apparatus of claim 11 that further comprises an array of standoffs, each of which has a hole for receiving a connector bolt and an array of springs, each of which has a hole for receiving a connector bolt.

15. The heat sink apparatus of claim 11 that further comprises an array of standoffs, each of which has a hole for receiving a connector bolt and each of which is part of the unitary piece that constitutes the heat sink, and an array of springs, each of which has a hole for receiving a connector bolt.

16. The heat sink apparatus of claim 11 wherein the cavity further comprises a ledge for holding a fan housing and an upper cavity region in which fan blades rotate.

17. The heat sink apparatus of claim 11 wherein the cavity wall has a lowered region for passing wires leading from a fan motor to the exterior of the heat sink.

18. The heat sink apparatus of claim 11 wherein the base has a flat underside.

19. The heat sink apparatus of claim 11 wherein the base has an underside that further comprises a plate-like protruding portion.

20. The heat sink apparatus of claim 11 wherein the base has an underside that further comprises a cavity for receiving a chip.

* * * * *